(12) United States Patent
Kwon

(10) Patent No.: US 9,627,239 B2
(45) Date of Patent: Apr. 18, 2017

(54) WAFER SURFACE 3-D TOPOGRAPHY MAPPING BASED ON IN-SITU TILT MEASUREMENTS IN CHEMICAL VAPOR DEPOSITION SYSTEMS

(71) Applicant: Veeco Instruments, Inc., Plainview, NY (US)

(72) Inventor: Daewon Kwon, Whippany, NJ (US)

(73) Assignee: Veeco Instruments Inc., Plainview, NY (US)

( * ) Notice: Subject to any disclaimer, the term of this patent is extended or adjusted under 35 U.S.C. 154(b) by 12 days.

(21) Appl. No.: 14/725,997

(22) Filed: May 29, 2015

(65) Prior Publication Data

US 2016/0351426 A1 Dec. 1, 2016

(51) Int. Cl.
| | |
|---|---|
| *G01N 21/956* | (2006.01) |
| *H04N 5/225* | (2006.01) |
| *H01L 21/67* | (2006.01) |
| *G01B 11/06* | (2006.01) |
| *G01B 11/00* | (2006.01) |
| *C23C 16/458* | (2006.01) |
| *C23C 16/52* | (2006.01) |

(52) U.S. Cl.
CPC .... *H01L 21/67288* (2013.01); *C23C 16/4584* (2013.01); *C23C 16/52* (2013.01); *G01B 11/002* (2013.01); *G01B 11/0608* (2013.01); *H01L 21/67259* (2013.01)

(58) Field of Classification Search
CPC ............ G01B 11/2441; G01B 11/2509; G01B 11/0608; G01B 9/02083; H01L 21/67109; H01L 21/68764; H01L 21/68771

USPC .......... 356/601–614, 625–636, 237.4–237.5, 356/326; 250/201.9
See application file for complete search history.

(56) References Cited

U.S. PATENT DOCUMENTS

| | | | |
|---|---|---|---|
| 5,521,657 A * | 5/1996 | Klopotek | ............. A61B 5/0095 351/212 |
| 6,492,625 B1 | 12/2002 | Boguslavskiy et al. | |
| 6,506,252 B2 | 1/2003 | Boguslavskiy et al. | |
| 6,902,623 B2 | 6/2005 | Gurary et al. | |
| 7,276,124 B2 | 10/2007 | Gurary et al. | |
| 8,021,487 B2 | 9/2011 | Boguslavskiy et al. | |
| 8,092,599 B2 | 1/2012 | Sferlazzo et al. | |

(Continued)

FOREIGN PATENT DOCUMENTS

| | | |
|---|---|---|
| JP | 2004080001 A | 3/2004 |
| JP | 2005045213 A | 2/2005 |

OTHER PUBLICATIONS

Application and File history for U.S. Appl. No. 14/605,497, filed Jan. 26, 2015. Inventors Krishnan et al.

(Continued)

*Primary Examiner* — Sang Nguyen
(74) *Attorney, Agent, or Firm* — Patterson Thuente Pedersen, P.A.

(57) ABSTRACT

The surface topography of at least one wafer can be determined in-situ based on deflectometer measurements of surface tilt. The deflectometer is re-positioned by a scanning positioner to facilitate tilt mapping of the wafer surface for each of the at least one wafer. A surface height mapping engine is configured to generate a three-dimensional topographic mapping of the surface of each of the at least one wafer based on the mapping of the tilt.

20 Claims, 11 Drawing Sheets

(56) References Cited

U.S. PATENT DOCUMENTS

| | | | |
|---|---|---|---|
| 8,311,788 B2* | 11/2012 | Hurley | G06T 17/00 703/10 |
| 8,535,445 B2 | 9/2013 | Volf et al. | |
| 8,928,892 B2* | 1/2015 | Meimoun | A61B 3/1015 250/201.9 |
| 2003/0011771 A1* | 1/2003 | Moriyama | G03F 7/70483 356/399 |
| 2004/0053143 A1 | 3/2004 | Sandstrom | |
| 2004/0130691 A1 | 7/2004 | Boonman et al. | |
| 2004/0184031 A1* | 9/2004 | Vook | G06T 7/0002 356/237.1 |
| 2004/0263862 A1 | 12/2004 | Amparan et al. | |
| 2007/0186853 A1 | 8/2007 | Gurary et al. | |
| 2009/0155028 A1 | 6/2009 | Boguslavskiy et al. | |
| 2010/0231881 A1 | 9/2010 | Den Boef et al. | |
| 2012/0040097 A1 | 2/2012 | Volf et al. | |
| 2012/0307233 A1* | 12/2012 | Boguslavskiy | H01L 21/67109 356/43 |
| 2013/0081390 A1 | 4/2013 | Takahashi et al. | |
| 2013/0276704 A1 | 10/2013 | Krishnan et al. | |
| 2014/0233040 A1* | 8/2014 | Gergen | G01B 11/0608 356/609 |
| 2014/0261187 A1 | 9/2014 | Krishnan et al. | |

OTHER PUBLICATIONS

International Search Report and Written Opinion, for PCT Application No. PCT/US2015/012884, dated Apr. 30, 2015, 8 pages.
International Search Report and Written Opinion, for PCT Application No. PCT/US2016/033995, dated Aug. 19, 2016, 7 pages.
Preliminary Report on Patentability, for PCT Application No. PCT/US2015/012884, dated Aug. 11, 2016, 5 pages.

* cited by examiner

WAFER SURFACE 3-D TOPOGRAPHY MAPPING BASED ON IN-SITU TILT MEASUREMENTS IN CHEMICAL VAPOR DEPOSITION SYSTEMS

FIELD OF THE INVENTION

The invention relates generally to semiconductor fabrication technology and, more particularly, to chemical vapor deposition (CVD) processing and associated apparatus having features for reducing temperature non-uniformities on semiconductor wafer surfaces during processing.

BACKGROUND OF THE INVENTION

In the fabrication of light-emitting diodes (LEDs) and other high-performance devices such as laser diodes, optical detectors, and field effect transistors, a chemical vapor deposition (CVD) process is typically used to grow a thin film stack structure using materials such as gallium nitride over a sapphire or silicon substrate. A CVD tool includes a process chamber, which is a sealed environment that allows infused gases to be deposited upon the substrate (typically in the form of wafers) to grow the thin film layers. Examples of current product lines of such manufacturing equipment include the TurboDisc®, MaxBright®, and EPIK™ family of MOCVD systems, manufactured by Veeco Instruments Inc. of Plainview, N.Y. Another example is the PROPEL™ Power GaN MOCVD system, also by Veeco Instruments.

A number of process parameters are controlled, such as temperature, pressure and gas flow rate, to achieve a desired crystal growth. Different layers are grown using varying materials and process parameters. For example, devices formed from compound semiconductors such as III-V semiconductors typically are formed by growing successive layers of the compound semiconductor using metal organic chemical vapor deposition (MOCVD). In this process, the wafers are exposed to a combination of gases, typically including a metal organic compound as a source of a group III metal, and also including a source of a group V element which flow over the surface of the wafer while the wafer is maintained at an elevated temperature. Generally, the metal organic compound and group V source are combined with a carrier gas which does not participate appreciably in the reaction as, for example, nitrogen. One example of a III-V semiconductor is gallium nitride, which can be formed by reaction of an organo-gallium compound and ammonia on a substrate having a suitable crystal lattice spacing, as for example, a sapphire wafer. The wafer is usually maintained at a temperature on the order of 700-1200° C. during deposition of gallium nitride and related compounds.

In a MOCVD process chamber, semiconductor wafers on which layers of thin film are to be grown are placed on rapidly-rotating carousels, referred to as wafer carriers, to provide a uniform exposure of their surfaces to the atmosphere within the reactor chamber for the deposition of the semiconductor materials. Rotation speed is on the order of 1,000 RPM. The wafer carriers are typically machined out of a highly thermally conductive material such as graphite, and are often coated with a protective layer of a material such as silicon carbide. Each wafer carrier has a set of circular indentations, or pockets, in its top surface in which individual wafers are placed. Some examples of pertinent technology are described in U.S. Patent Application Publication No. 2012/0040097, U.S. Pat. No. 8,092,599, U.S. Pat. No. 8,021,487, U.S. Patent Application Publication No. 2007/0186853, U.S. Pat. No. 6,902,623, U.S. Pat. No. 6,506,252, and U.S. Pat. No. 6,492,625, the disclosures of which are incorporated by reference herein.

In some embodiments, the wafer carrier is supported on a spindle within the reaction chamber so that the top surface of the wafer carrier having the exposed surfaces of the wafers faces upwardly toward a gas distribution device. While the spindle is rotated, the gas is directed downwardly onto the top surface of the wafer carrier and flows across the top surface toward the periphery of the wafer carrier. The used gas is evacuated from the reaction chamber through ports disposed below the wafer carrier. The wafer carrier is maintained at the desired elevated temperature by heating elements, typically electrical resistive heating elements disposed below the bottom surface of the wafer carrier. These heating elements are maintained at a temperature above the desired temperature of the wafer surfaces, whereas the gas distribution device typically is maintained at a temperature well below the desired reaction temperature so as to prevent premature reaction of the gases. Therefore, heat is transferred from the heating elements to the bottom surface of the wafer carrier and flows upwardly through the wafer carrier to the individual wafers. In other embodiments, the wafer carrier can be supported and rotated by a rotation system that does not require a spindle. Such a rotation system is described in U.S. Patent Application Publication No. 2015/0075431, the contents of which are hereby incorporated by reference herein. In yet other embodiments, the wafer carrier holding at least one wafer is placed face down (inverted) in the reaction chamber and the gas distribution device is situated below the wafer carrier such that the process gases flow upwardly towards the at least one wafer. Examples of such inverted gas injection systems are described in U.S. Pat. No. 8,133,322, U.S. Patent Application Publication No. 2004/0175939, and U.S. Patent Application Publication No. 2004/0060518, the contents of which are hereby incorporated by reference herein.

In a MOCVD process, where the growth of crystals occurs by chemical reaction on the surface of the substrate, the process parameters must be controlled with particular care to ensure that the chemical reaction proceeds under the required conditions. Even small variations in process conditions can adversely affect device quality and production yield. For instance, if a gallium and indium nitride layer is deposited, variations in wafer surface temperature will cause variations in the composition and bandgap of the deposited layer. Because indium has a relatively high vapor pressure, the deposited layer will have a lower proportion of indium and a greater bandgap in those regions of the wafer where the surface temperature is higher. If the deposited layer is an active, light-emitting layer of an LED structure, the emission wavelength of the LEDs formed from the wafer will also vary to an unacceptable degree.

A great deal of effort has been devoted to system design features to minimize temperature variations of the wafers during processing. One challenge encountered in this effort relates to changes in surface profile of the wafers at various stages of processing. In an epitaxial growth process, the materials which form a semiconductor layer are deposited onto the surface of the substrate, forming a generally crystalline structure. The spacing between atoms within a crystal lattice (referred to as the "lattice spacing") depends upon the composition of the crystal. Where the grown layer has a composition different from the composition of the substrate, the deposited layer may have a nominal lattice spacing, different from the lattice spacing of the substrate. In this case, the deposited crystalline layer forms with its lattice spacing stretched or compressed to conform to the lattice spacing of the substrate. As the grown layer is built up, the forces arising from the lattice mismatch at the surface of each wafer cause the wafer to deform.

The deformation tends to take a generally convex or concave shape, depending on the relative physical properties of the grown lattice and of the substrate material. The deformed shape of the wafers causes variations in spacing between the bottom of each wafer and the corresponding pocket floor of the wafer carrier. In turn, these spacing variations affect the heating uniformity of the wafers. This problem has been described in U.S. Pat. No. 7,570,368, the disclosure of which is incorporated by reference herein, which is each directed to measuring and estimating the curvature of wafer deformation. European Patent No. EP 2546600, the disclosure of which is also incorporated by reference herein, estimates a mean spherical curvature, as well as an azimuthal aspherical curvature deviation.

These approaches produce approximations of the curvature of each wafer based on collected measurements. However, in practice each wafer tends to deform in an irregular fashion. Thus, for example, rather than forming spherical bow or even a spherical bow with azimuthal deviation, which can be modeled based on a limited set of measurements, each wafer tends to bow in a unique, potato chip-like, form. Moreover, the extent and shape of deformation vary over the course of a process as the grown layers increase and as thermal conditions may vary in the reaction chamber.

A solution is needed to obtain a more accurate characterization of the in-process wafer deformation, for which various equipment or processing optimizations might be developed.

SUMMARY OF THE INVENTION

One aspect of the invention is directed to a system for analyzing a surface of at least one wafer. The system includes a deflectometer arranged to emit a beam toward a measurement point on the at least one wafer such that the beam is reflected from a surface of the at least one wafer to a deflection sensor, wherein variation in a tilt of a surface of the at least one wafer causes deflection of the beam detectable by the deflection sensor.

A scanning positioner is arranged to re-position the deflectometer over the at least one wafer such that the beam emitted by the deflectometer is scanned over a surface of the at least one wafer.

Additionally, the system includes a tilt mapping engine operatively coupled with an output of the deflectometer and configured to generate a mapping of the tilt measured at a plurality of measurement points throughout the surface of the at least one wafer by the deflectometer. A surface height mapping engine is operatively coupled with the tilt mapping engine and configured to generate a three-dimensional topographic mapping of the surface of the at least one wafer based on the mapping of the tilt. The three-dimensional topographic mapping is stored in a non-transitory computer-readable medium for output via a user interface device, or for further computational processing.

In a related aspect, the system is integrated with a tool for growing epitaxial layers on at least one wafer by chemical vapor deposition (CVD). The tool includes a reaction chamber with an enclosure defining a process environment space, a gas distribution device situated within the reaction chamber and arranged to convey at least one process gas into the process environment space, and a rotation system arranged to support a wafer carrier that retains the at least one wafer. In some embodiments, a spindle, coupled to a rotary drive mechanism, is used to support the wafer carrier. In other embodiments, the wafer carrier is supported at its perimeter by a rotating tube, where the wafer carrier supports all or a portion of the bottom surface of the wafer. In yet other embodiments, an individual wafer is retained by a rotation system without any wafer carrier.

BRIEF DESCRIPTION OF THE DRAWINGS

The invention may be more completely understood in consideration of the following detailed description of various embodiments of the invention in connection with the accompanying drawings, in which:

FIG. 8A illustrates the tilt values for the radial direction, and FIG. 8B illustrates the tilt values for the tangential direction.

Figure 1:
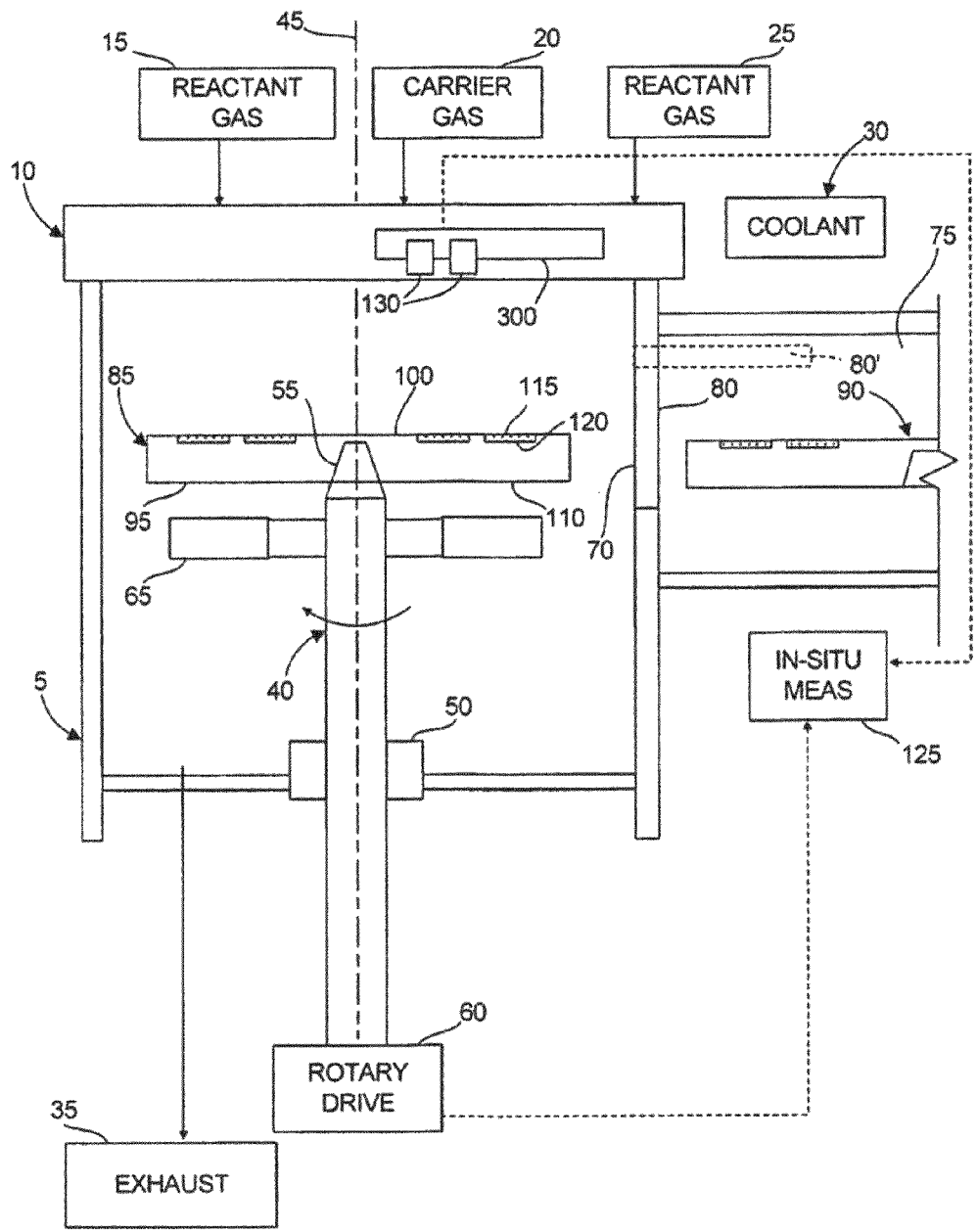
FIG. 1 illustrates a chemical vapor deposition apparatus in accordance with one embodiment of the invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

FIG. 1 illustrates a chemical vapor deposition apparatus in accordance with one embodiment of the invention. Reaction chamber 5 has an enclosure that defines a process environment space. Gas distribution device 10 is arranged at one end of the chamber. The end having gas distribution device 10 is referred to herein as the "top" end of reaction chamber 5. This end of the chamber typically, but not necessarily, is disposed at the top of the chamber in the normal gravitational frame of reference. Thus, the downward direction as used herein refers to the direction away from gas distribution device 10; whereas the upward direction refers to the direction within the chamber, toward gas distribution device 10, regardless of whether these directions are aligned with the gravitational upward and downward directions. Similarly, the "top" and "bottom" surfaces of elements are described herein with reference to the frame of reference of reaction chamber 5 and gas distribution device 10.

Gas distribution device 10 is connected to sources 15, 20, and 25 for supplying process gases to be used in the wafer treatment process, such as a carrier gas and reactant gases, such as a metalorganic compound and a source of a group V metal. Gas distribution device 10 is arranged to receive the various gases and direct a flow of process gasses generally in the downward direction. Gas distribution device 10 desirably is also connected to coolant system 30 arranged to circulate a liquid through gas distribution device 10 so as to maintain the temperature of the gas distribution device at a desired temperature during operation. A similar coolant arrangement (not shown) can be provided for cooling the walls of reaction chamber 5. Reaction chamber 5 is also equipped with exhaust system 35 arranged to remove spent gases from the interior of the chamber through ports (not shown) at or near the bottom of the chamber so as to permit continuous flow of gas in the downward direction from gas distribution device 10.

An example of a suitable rotation system includes spindle 40, which is arranged within the chamber so that the central axis 45 of spindle 40 extends in the upward and downward directions. Spindle 40 is mounted to the chamber by a conventional rotary pass-through device 50 incorporating bearings and seals (not shown) so that spindle 40 can rotate about central axis 45, while maintaining a seal between spindle 40 and the wall of reaction chamber 5. The spindle has fitting 55 at its top end, i.e., at the end of the spindle closest to gas distribution device 10. As further discussed below, fitting 55 is an example of a wafer carrier retention mechanism adapted to releasably engage a wafer carrier. In the particular embodiment depicted, fitting 55 is a generally frustoconical element tapering toward the top end of the spindle and terminating at a flat top surface. A frustoconical element is an element having the shape of a frustum of a cone. Spindle 40 is connected to rotary drive mechanism 60 such as an electric motor drive, which is arranged to rotate spindle 40 about central axis 45.

Heating element 65 is mounted within the chamber and surrounds spindle 40 below fitting 55. Reaction chamber 5 is also provided with entry opening 70 leading to antechamber 75, and door 80 for closing and opening the entry opening. Door 80 is depicted only schematically in FIG. 1, and is shown as movable between the closed position shown in solid lines, in which the door isolates the interior of reaction chamber 5 from antechamber 75, and an open position shown in broken lines at 80'. The door 80 is equipped with an appropriate control and actuation mechanism for moving it between the open position and closed positions. In practice, the door may include a shutter movable in the upward and downward directions as disclosed, for example, in U.S. Pat. No. 7,276,124, the disclosure of which is hereby incorporated by reference herein. The apparatus depicted in FIG. 1 may further include a loading mechanism (not shown) capable of moving a wafer carrier from the antechamber 75 into the chamber and engaging the wafer carrier with spindle 40 in the operative condition, and also capable of moving a wafer carrier off of spindle 40 and into antechamber 75.

The apparatus according to the example depicted also includes a plurality of wafer carriers. In the operating condition shown in FIG. 1, a first wafer carrier 85 is disposed inside reaction chamber 5 in an operative position, whereas a second wafer carrier 90 is disposed within antechamber 75. Each wafer carrier includes body 95 which is substantially in the form of a circular disc having a central axis (See FIG. 2). Body 95 is formed symmetrically about central axis. In the operative position, the central axis of the wafer carrier body is coincident with central axis 45 of spindle 40. Body 95 may be formed as a single piece or as a composite of plural pieces. For example, as disclosed in U.S. Patent Application Publication No. 2009/0155028, the disclosure of which is hereby incorporated by reference herein, the wafer carrier body may include a hub defining a small region of the body surrounding the central axis and a larger portion defining the remainder of the disc-like body. Body 95 is desirably formed from materials which do not contaminate the process and which can withstand the temperatures encountered in the process. For example, the larger portion of the disc may be formed largely or entirely from materials such as graphite, silicon carbide, or other refractory materials. Body 95 generally has a planar top surface 100 and a bottom surface 110 extending generally parallel to one another and generally perpendicular to the central axis of the disc. Body 95 also has one, or a plurality, of wafer-holding features adapted to hold a plurality of wafers.

Figure 2:
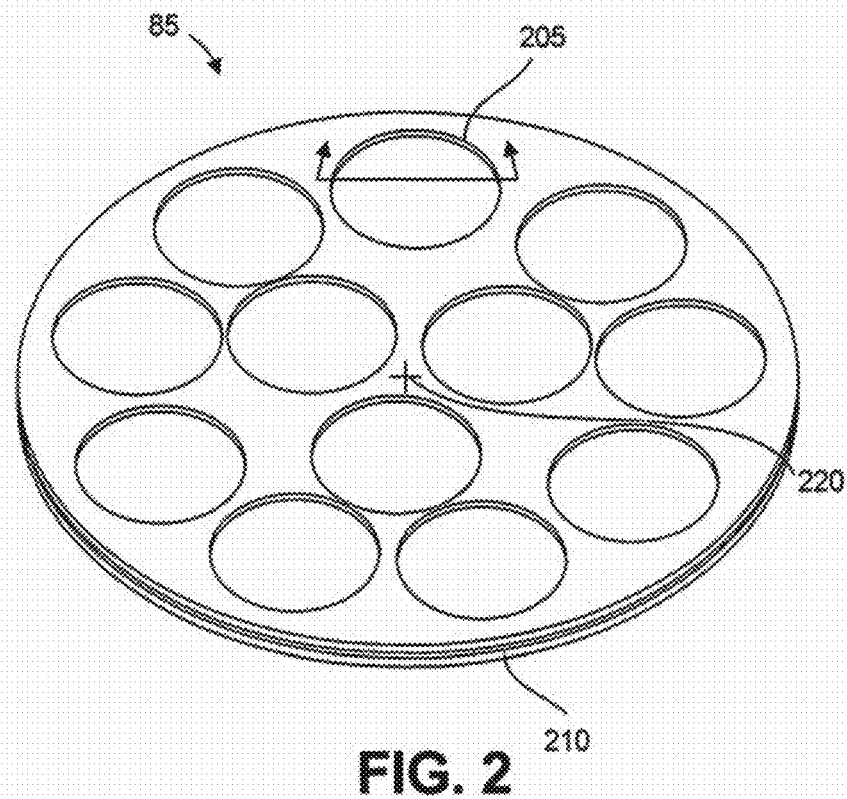
FIG. 2 is a perspective view diagram illustrating a wafer carrier used with a CVD system, according to one embodiment of the invention.

In operation, wafer 115, such as a disc-like wafer formed from sapphire, silicon carbide, or other crystalline substrate, is disposed within each pocket 120 of each wafer carrier. Typically, wafer 115 has a thickness which is small in comparison to the dimensions of its major surfaces. For example, a circular wafer of about 2 inches (50 mm) in diameter may be about 430 μm thick or less. As illustrated in FIG. 1, wafer 115 is disposed with a top surface facing upwardly, so that the top surface is exposed at the top of the wafer carrier. It should be noted that in various embodiments, wafer carrier 85 carries different quantities of wafers. For instance, in one example embodiment, wafer carrier 85 can be adapted to hold six wafers. In another example embodiment, as shown in FIG. 2, the wafer carrier holds 12 wafers.

In a typical MOCVD process, wafer carrier 85 with wafers loaded thereon is loaded from antechamber 75 into reaction chamber 5 and placed in the operative position shown in FIG. 1. In this condition, the top surfaces of the wafers face upwardly, towards gas distribution device 10. Heating element 65 is actuated, and rotary drive mechanism 60 operates to turn spindle 40 and hence wafer carrier 85 around axis 45. Typically, spindle 40 is rotated at a rotational speed from about 50-1500 revolutions per minute. Process gas supply units 15, 20, and 25 are actuated to supply gases through gas distribution device 10. The gases pass downwardly toward wafer carrier 85, over top surface 100 of wafer carrier 85 and wafers 115, and downwardly around the periphery of the wafer carrier to the outlet and to exhaust system 50. Thus, the top surface of the wafer carrier and the top surfaces of wafer 115 are exposed to a process gas including a mixture of the various gases supplied by the various process gas supply units. Most typically, the process gas at the top surface is predominantly composed of the carrier gas supplied by carrier gas supply unit 20. In a typical chemical vapor deposition process, the carrier gas may be nitrogen, and hence the process gas at the top surface of the wafer carrier is predominantly composed of nitrogen with some amount of the reactive gas components.

Heating elements 65 transfer heat to the bottom surface 110 of wafer carrier 85, principally by radiant heat transfer. The heat applied to the bottom surface of wafer carrier 85 flows upwardly through the body 95 of the wafer carrier to the top surface 100 of the wafer carrier. Heat passing upwardly through the body also passes upwardly through gaps to the bottom surface of each wafer, and upwardly through the wafer to the top surface of wafer 115. Heat is radiated from the top surface 100 of wafer carrier 85 and from the top surfaces of the wafer to the colder elements of the process chamber as, for example, to the walls of the process chamber and to gas distribution device 10. Heat is also transferred from the top surface 100 of wafer carrier 85 and the top surfaces of the wafers to the process gas passing over these surfaces.

In a related embodiment (not shown in FIG. 1), wafer carrier 85 is mounted on a rotatable platform or other retention structure, such as a turntable or rotating tube structure that contacts the wafer carrier only at or near its edges, in lieu of spindle 40.

In another related embodiment (also not shown in FIG. 1), the system is designed to operate on one single wafer and hence does not require a wafer carrier. In this latter type of embodiment, the wafer is retained by one or more retention features of the turntable or rotating tube. In the broader sense, the spindle, turntable, or rotating tube, along with the necessary mechanics to impart and control rotational motion thereof, can be regarded as a rotation system.

In the embodiment depicted, the system includes various sensors and associated measurement hardware to perform in-situ measurements of physical parameters, such as temperature sensing, photoluminescence measurement, or surface feature measurement, for instance. As illustrated schematically in FIG. 1, in-situ measurement controller 125 obtains data from one or more sensors 130, as well as positional information from those sensors representing the respective location of the sensors, where relevant. In addition, in-situ measurement controller 125 receives wafer carrier positional information, which in one embodiment can come from rotary drive mechanism 60. The wafer carrier positional information represents an angular position of the wafer carrier, from which the relative position of a given sensor 130 and a given wafer 115 can be discerned. With this information, in-situ measurement controller 125 computes the in-situ measurement data that may be mapped to specific points on the wafers 115 or wafer carrier 85.

In a related embodiment, sensors 130 are mounted on a scanning positioner 300. Scanning positioner 300, which is described in greater detail below, includes a mechanism arranged to move one or more sensors 130 to different positions over wafer carrier 100.

Figure 3:
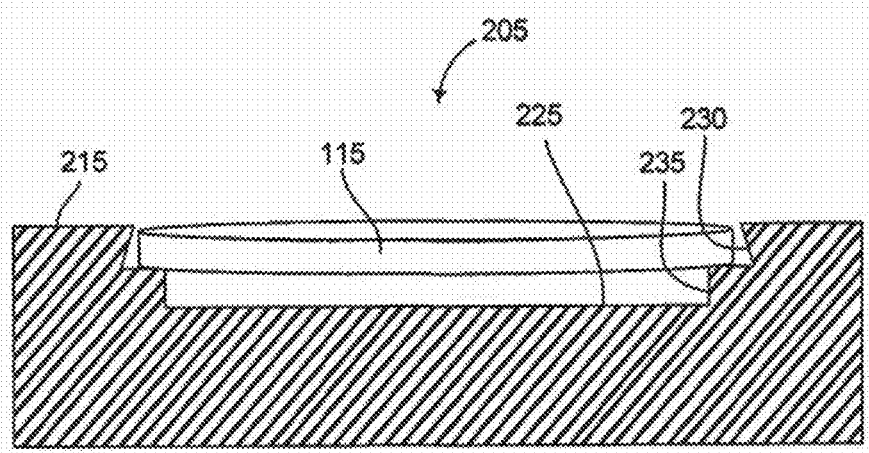
FIG. 3 is a diagram of a cross-sectional view taken along the line shown, detailing a wafer pocket of the wafer carrier of FIG. 2, according to one embodiment of the invention.

FIGS. 2 and 3 illustrate wafer carrier 85, also referred to as a susceptor, in greater detail. Each wafer retention site is in the form of a generally circular recess, or pocket 205, extending downwardly into body 210 from the top surface 215. FIG. 3 is a cross-sectional view of pocket 205 (demarcated with a horizontal line and two angled arrow in FIG. 2). The generally circular shape is made to correspond to the shape of wafer 115. Each wafer carrier 85 includes body 210 which is substantially in the form of a circular disc having a central axis 220. Body 210 is formed symmetrically about central axis 220. In the operative position, the central axis 220 of wafer carrier body 210 is coincident with the axis of the spindle (See FIG. 3). Body 210 may be formed as a single piece or as a composite of plural pieces. Each pocket 205 has a floor surface 225 disposed below the surrounding portions of top surface 215. Each pocket 205 also has a peripheral wall surface 230 surrounding floor surface 225 and defining the periphery of pocket 205. Peripheral wall surface 230 extends downwardly from the top surface 215 of body 210 to floor surface 225. In various embodiments, as depicted in particular in FIG. 3, peripheral wall surface 230 has an undercut where the wall slopes inwards, towards the center of the pocket, over at least a portion of the periphery. Thus, peripheral wall surface 230 forms an acute angle relative to floor surface 225. In a related embodiment, as illustrated in FIG. 3, each pocket 205 includes an elevated ledge 235 around the periphery of the pocket that supports wafer 115 along a small portion of its bottom surface nearest its outer edge, leaving a great majority (e.g., >95%) of the bottom surface suspended some distance over pocket floor 225. This arrangement facilitates the use of gas between the pocket floor 225 and wafer 115 to affect heat transfer to the wafer, and provides space for the wafer to deform due to bowing without causing any significant change in the wafer-pocket periphery interface.

Figure 4A:
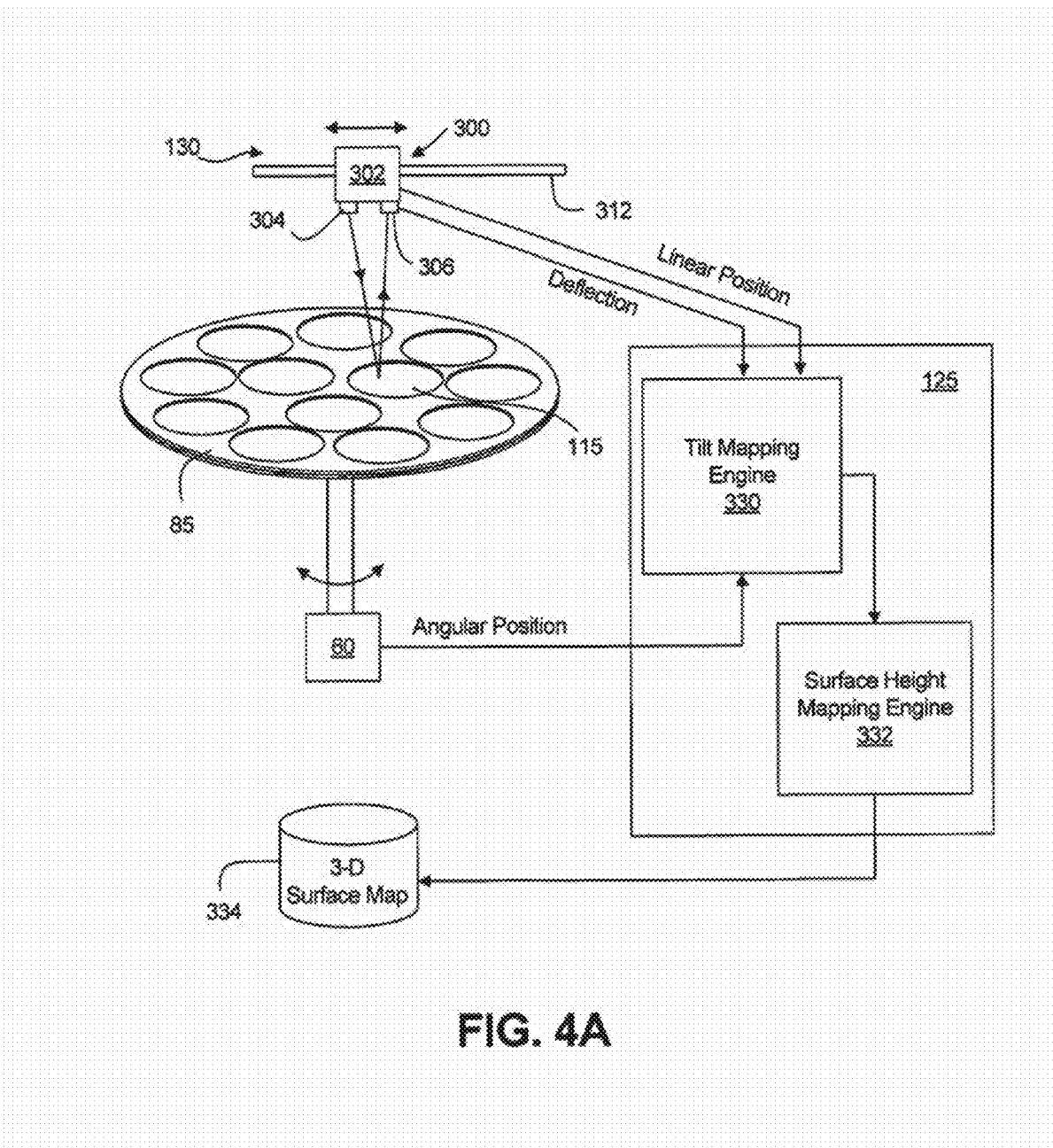
FIGS. 4A and 4B are a block diagrams illustrating in-situ measurement arrangements that obtain two-dimensional tilt angle measurements from the surface of wafers during processing via a deflectometer instrument, and based on those measurements, compute a three-dimensional topographic map representing the height profile of the wafer surface according to one aspect of the invention.
Figure 4B:
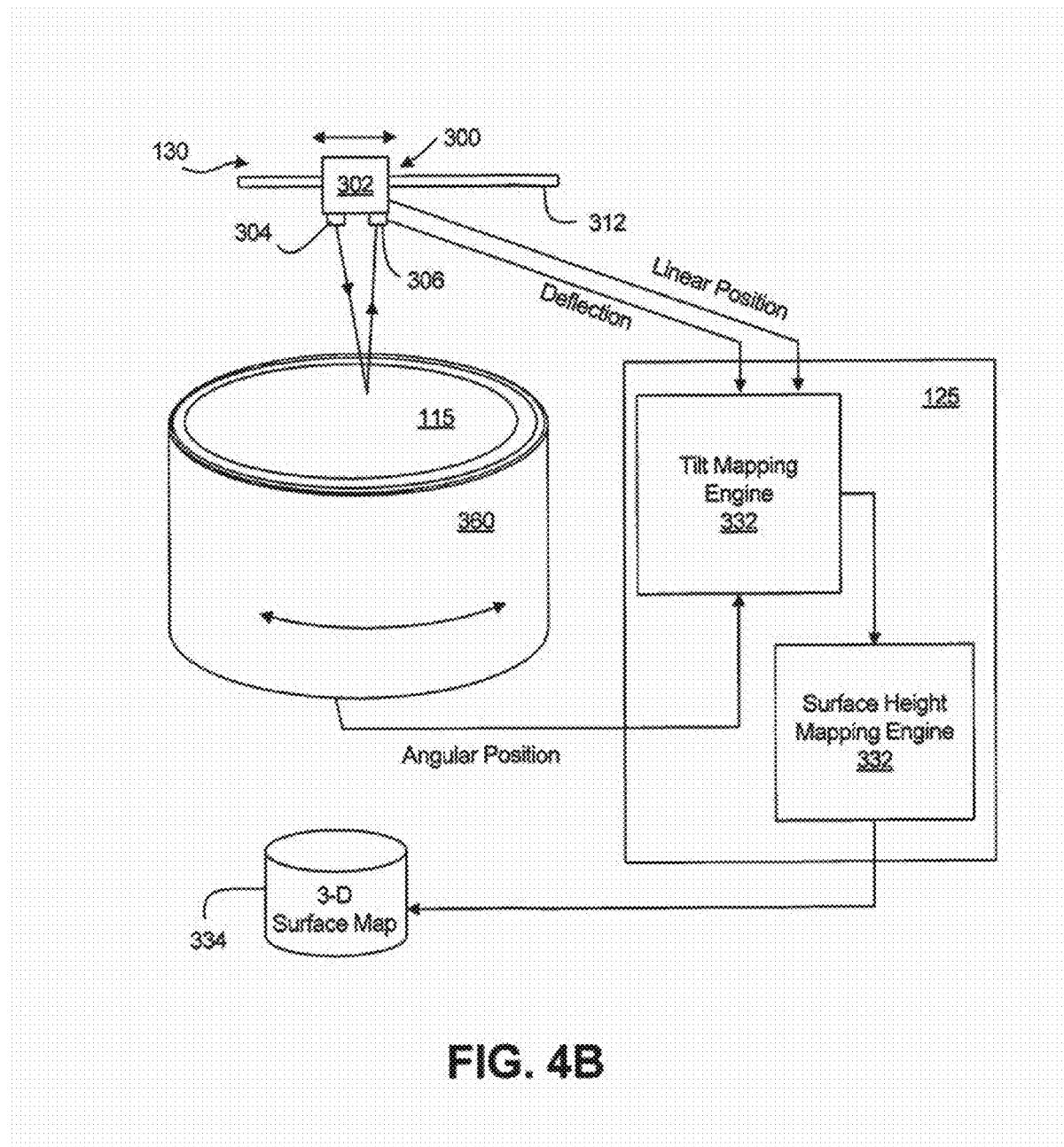

Turning now to FIGS. 4A and 4B, an in-situ measurement arrangement is depicted that obtains two-dimensional tilt angle measurements from the surface of wafers 115 during processing and, based on those measurements, computes a three-dimensional topographic map representing the height profile of the wafer surface according to one aspect of the invention. FIG. 4A is a schematic diagram illustrating an exemplary set of components according to one embodiment, in which wafer carrier 85 is accommodated. FIG. 4B is a similar arrangement, only instead of a wafer carrier 85 as depicted in FIG. 4A, here, a single wafer 115 is retained by rotating tube 360. In each of FIGS. 4A and 4B, portions of in-situ measurement controller 125 and sensor 130 are shown in greater detail.

Sensor 130 in this embodiment includes a deflectometer 302 having a beam emitter 304 and a beam deflection sensor 306, along with additional hardware described in greater detail below. In general, beam emitter 304 is arranged to direct an incident laser beam onto the top of wafer carrier 85, including onto wafers 115, as the wafer carrier is rotated by rotary drive mechanism 60. The incident beam is reflected from the surface of wafers 115 as the wafers travel under the beam. Depending on the wafer carrier surface material, the incident beam may or may not reflect from the portions of the top surface of wafer carrier 85 that are not covered by wafers 115. The reflected beam is reflected generally towards beam deflection sensor 306.

In the embodiment depicted, the entire surface of each wafer 115 can be scanned in this manner. Accordingly, deflectometer 302 is movable over the surface of wafer carrier 85. In one embodiment, a scanning positioner 300 facilitates this motion. For instance, scanning positioner 300 provides re-positioning of deflectometer 302 so that the incident beam can be positioned anywhere between the inner-most edge of the wafers 115 located at the smaller radial distance from the center of wafer carrier 85, and the outer-most edge of the wafers 115 located at the largest radial distance from the center of wafer carrier 85. In one particular case, linear movement of deflectometer 302 between a point above the center of wafer carrier 85 to the outer edge of wafer carrier 85 (essentially, spanning approximately the radius of wafer carrier 85) is facilitated by linear positioner 312.

In one such embodiment, linear positioner 312 includes a track, a rail, a channel, or other suitable guide along which deflectometer 302 traverses. Motion can be provided by any suitable mechanical arrangement, such as via belt or chain drive, pulley, screw, gear, linear motor, or the like (or any combination thereof).

The linear position of the deflectometer along the linear positioner 312 is a known or discernible parameter during operation. Likewise, the angular position of the wafer carrier 85 is reported by rotary drive mechanism 60, or other angular sensing arrangement such as an encoder, for instance. The linear position of the deflectometer 302 and the angular position of wafer carrier 85 at any given instant in time provide sufficient data from which to determine the point along the surface of wafers 115 (or wafer carrier 85) at which the incident beam is aiming.

In a related embodiment, movement of deflectometer 302 by scanning positioner 300 is not strictly linear. For instance, arc-shaped, elliptical, parabolic, spiral, or other movement, may be facilitated by a corresponding arc-shaped track structure and suitable actuator(s).

Figure 5:
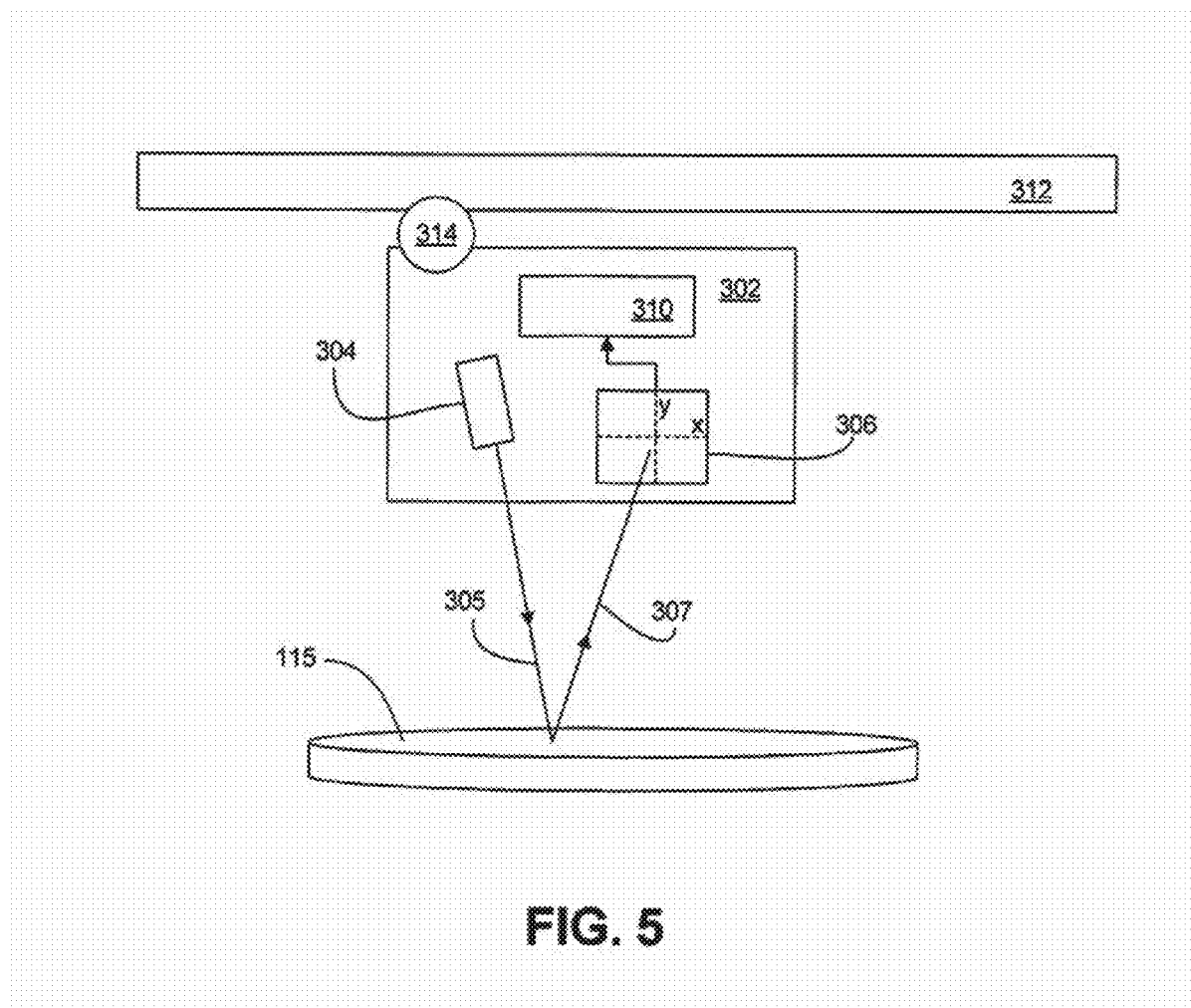
FIG. 5 is a schematic diagram illustrating the construction, and operation, of a deflectometer according to a one embodiment.

FIG. 5 is a schematic diagram illustrating the construction, and operation, of deflectometer 302 in greater detail according to a related embodiment. Beam emitter 304, which can be a laser in the infrared, visible, or ultraviolet spectra, produces incident beam 305, which impinges on the surface of wafer 115. Reflected beam 307 travels to deflection sensor 306. Deflection sensor 306 can comprise an optical image sensor (e.g., an array of charge-coupled devices (CCDs) or CMOS devices), that are sensitive to the wavelength of reflected beam 307. The instrument can also include optical components such as lenses, mirrors, filters, beam splitters and the like, though for the sake of clarity these components are not shown in FIG. 5.

Deflection sensor 306 is arranged such that, nominally, reflected beam 307 strikes at or near the center of the sensor when the target point on the surface of wafer 115 at which incident beam 305 is aiming is flat (i.e., has a zero tilt, or slope). When the target point on the wafer is on a part of the surface that is tilted, as would be the case when wafer 115 has a concave or convex curvature, for example, reflected beam 307 is deflected from its nominal point on deflection sensor 306. Accordingly, deflectometer 302 can measure the tilt (in terms of x and y deflections on the deflection sensor 306). Data converter 310 reads the output from deflection sensor 306 and converts it to a digital format (e.g., floating point values) to be communicated via serial or parallel data bus, or wirelessly, to in-situ measurement controller 125.

Referring again to FIG. 4, in-situ measurement controller 125 includes tilt mapping engine 330, and surface height mapping engine 332 according to the embodiment depicted. Each engine is constructed, programmed, configured, or otherwise adapted, to autonomously carry out a corresponding function or set of functions. The term engine as used herein means a real-world device, component, or arrangement of components implemented using hardware, such as by an application specific integrated circuit (ASIC) or field-programmable gate array (FPGA), for example, or as a combination of hardware and software, such as by a microprocessor system and a set of program instructions that adapt the engine to implement the particular autonomous functionality, which (while being executed) transform the microprocessor system into a special-purpose machine. An engine can also be implemented as a combination of the two, with certain functions facilitated by hardware alone, and other functions facilitated by a combination of hardware and software. In certain implementations, at least a portion, and in some cases, all, of an engine can be implemented using the processor(s) of one or more computers that execute an operating system, system programs, and application programs, while also implementing the engine (and thereby becoming a special-purpose machine). An engine can be implemented using multitasking, multithreading, distributed (e.g., cluster, peer-peer, cloud, etc.) processing where appropriate, or other such techniques. Accordingly, each engine can be physically realized in any of a variety of suitable physical and logical configurations, and should generally not be limited to any particular implementation exemplified herein, unless such limitations are expressly called out. In addition, an engine can itself be composed of more than one sub-engines, each of which can be regarded as an engine in its own right. Moreover, in the embodiments described herein, each of the various engines corresponds to a defined functionality; however, it should be understood that in other contemplated embodiments, each functionality may be distributed to more than one engine. Likewise, in other contemplated embodiments, multiple defined functionalities may be implemented by a single engine that performs those multiple functions, possibly alongside other functions, or distributed differently among a set of engines than specifically illustrated in the examples herein.

Tilt mapping engine 330 is programmed, or otherwise configured, to generate mappings of tilt, as measured at a multiplicity of points, over the wafer surfaces. Surface height mapping engine 332 is programmed, or otherwise configured, to generate wafer-specific surface topographical mappings representing the height of the wafer surface at a multiplicity of points over the surfaces, based on the tilt mapping for each wafer. Notably, the topographical mappings are a three-dimensional representation of the surfaces of the wafers obtained from the two-dimensional deflectometer measurements. In embodiments where there is only a single wafer in the reactor, the tilt mapping engine 330 is programmed, or otherwise configured, to generate mappings of tilt, as measured at a multiplicity of points, over the wafer's surface. Surface height mapping engine 332 is programmed, or otherwise configured, to generate wafer-specific surface topographical mappings representing the height of the wafer surface at a multiplicity of points over the wafer's surface, based on the tilt mapping of the single wafer. Notably, the topographical mappings are a three-dimensional representation of the surface of the wafer obtained from the two-dimensional deflectometer measurements.

The multiplicity of points used in the topographical mappings can be the same multiplicity of points (i.e., the same locations) as in the mappings of tilt according to one embodiment; or they can be different according to other embodiments. For instance, the topographical mappings can be defined having more, or fewer, points on the wafer than the mappings of tilt.

Figure 6:
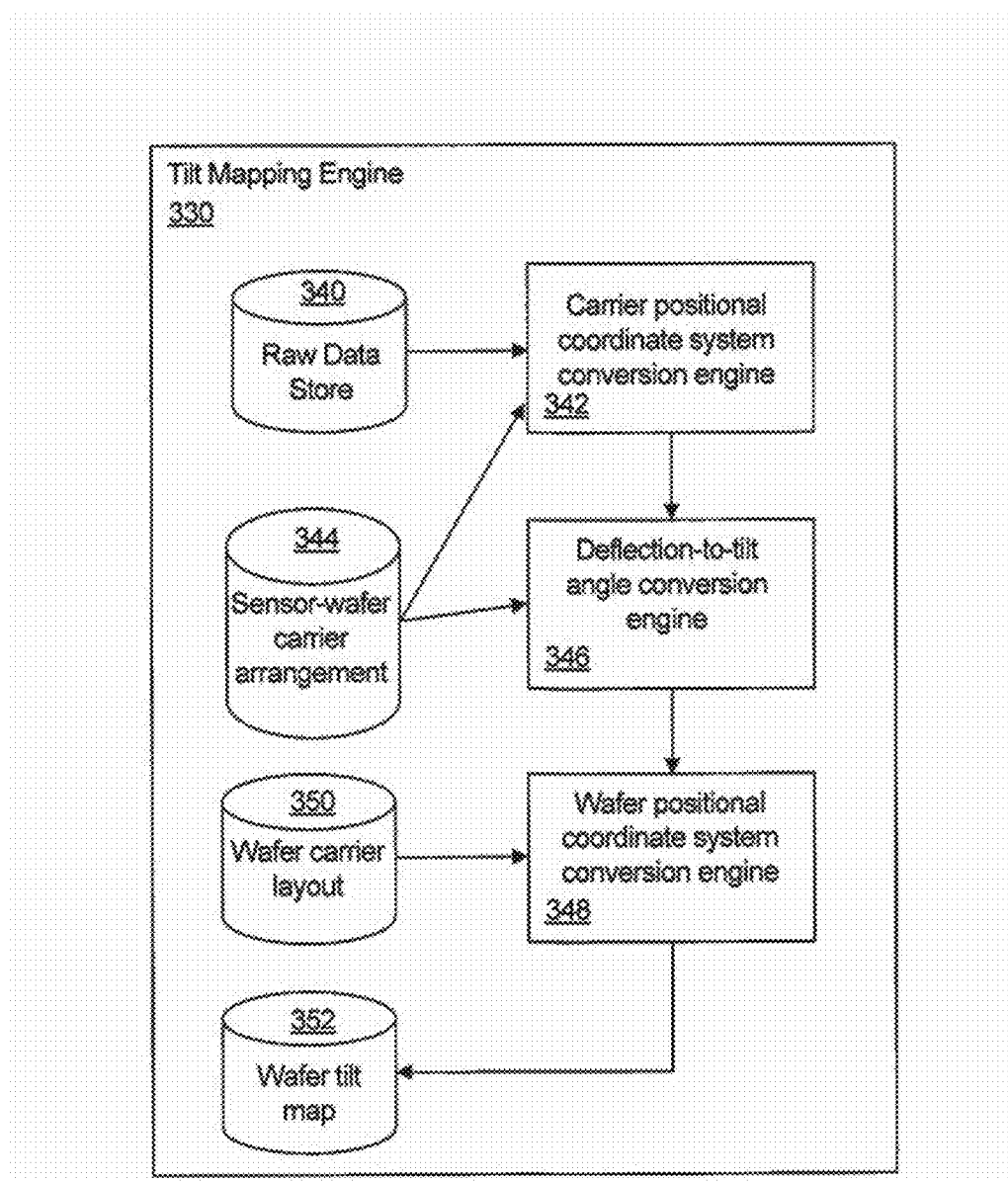
FIG. 6 is a block diagram illustrating a tilt mapping engine according to one embodiment.
Figure 7:
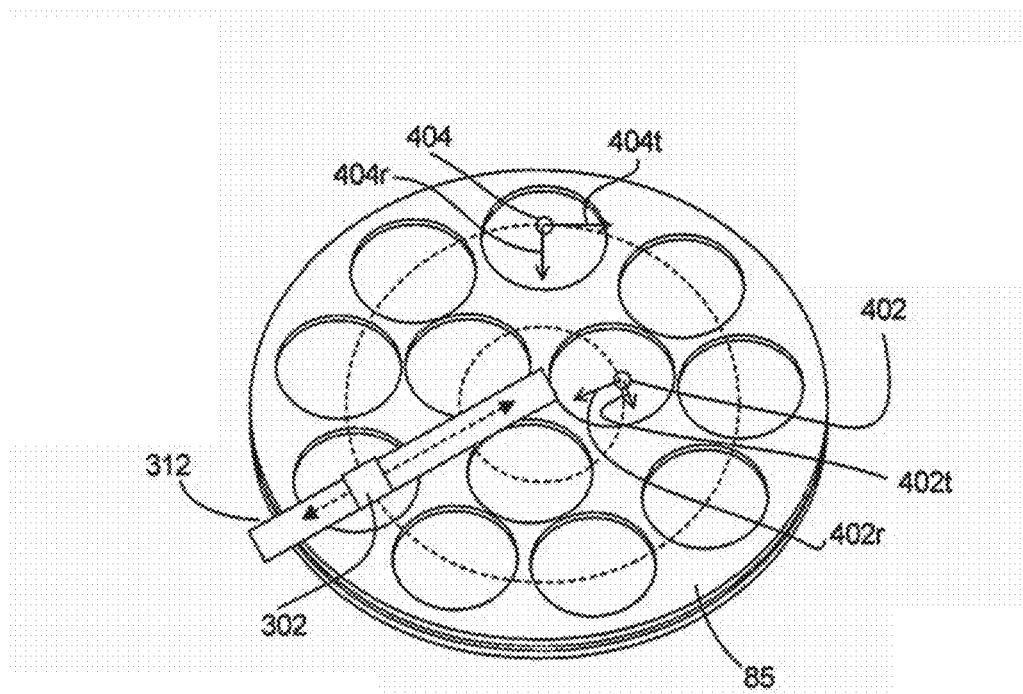
FIG. 7 is a top-view schematic diagram illustrating a measurement arrangement for a deflectometer movable radially along a linear positioner over a wafer carrier according to one embodiment.

FIG. 6 is a block diagram illustrating tilt mapping engine 330 in greater detail. Raw data store 340 contains all of the data points gathered by deflection sensor 306. This raw data is based on a coordinate system of deflectometer 302, namely, its linear position along scanning positioner 300, and the angular position of the wafer carrier. FIG. 7 is a top-view schematic diagram illustrating deflectometer 302 movable radially along linear positioner 312 over wafer carrier 85. As wafer carrier 85 is rotated, the deflection of the reflected beam 307 is measured by sensor 306 and, for each sampled point, the radial position of deflectometer 302 and angular position of wafer carrier 85 are recorded.

In the embodiment depicted, the x and y deflection axes of deflection sensor 306 are aligned respectively with the radius of wafer carrier 85, and the perpendicular thereto (i.e., along the tangential direction). Accordingly, at each sampled point, the raw data from which the tilt can be determined is recorded in terms of the radial and tangential components. For instance, at point 402, the raw data is recorded as the position of point 402 according to the coordinate system of the linear positioner 300 and rotary drive 60 of the wafer carrier (e.g., radius and angle), as well as the deflection at point 402 in the radial direction 402r, and the deflection at point 402 in the tangential direction 402t. Similarly, at point 404 at another wafer situated at a larger radius from the wafer carrier's center, the raw data is recorded as the position of point 404, along with the deflection in radial direction 404r and the deflection in tangential direction 404t. Notably, in other embodiments, the x and y deflection axes of sensor 306 are not necessarily aligned with the radial axis of wafer carrier 85.

It should be noted that, although only two points are shown in FIG. 7 for the sake of clarity of explanation, in a practical embodiment virtually the entire surface of wafer carrier 85 is measured for deflection with a large plurality of closely-spaced measurement points. Hence, raw data store 340 will contain a large number of measurement points. This data can be stored in any suitable data structure, e.g., a bitmap, a table, list, tree, vector, multi-dimensional array, or other suitable data structure.

Referring still to FIG. 6, coordinate system conversion engine 342 is programmed, or otherwise configured, to process the raw data from raw data store 340 in order to relate each data point to a location on the wafer carrier. Accordingly, sensor-wafer carrier arrangement data in data store 344 is provided to represent a mapping, relative to a point of reference of the wafer carrier 85, of the radial position of deflectometer 302 and the angular position reported by rotational drive 60. Thus, each point of the deflection data is mapped to a specific location on the wafer carrier 85, as represented by points 402 and 404 in FIG. 7.

Deflection-to-tilt angle conversion engine 346 is programmed, or otherwise configured, to convert the deflection amounts along each measured axis to a tilt angle. Sensor-wafer carrier arrangement data in database 344 includes parameters that relate the beam displacement value along each axis to a corresponding tilt angle of the surface being measured. Therefore, deflection-to-tilt angle conversion engine 346 applies these relationships to the measured deflection distance at sensor 306 to produce tilt angles for each measured point in the coordinate system of wafer carrier 85.

Figure 8A:
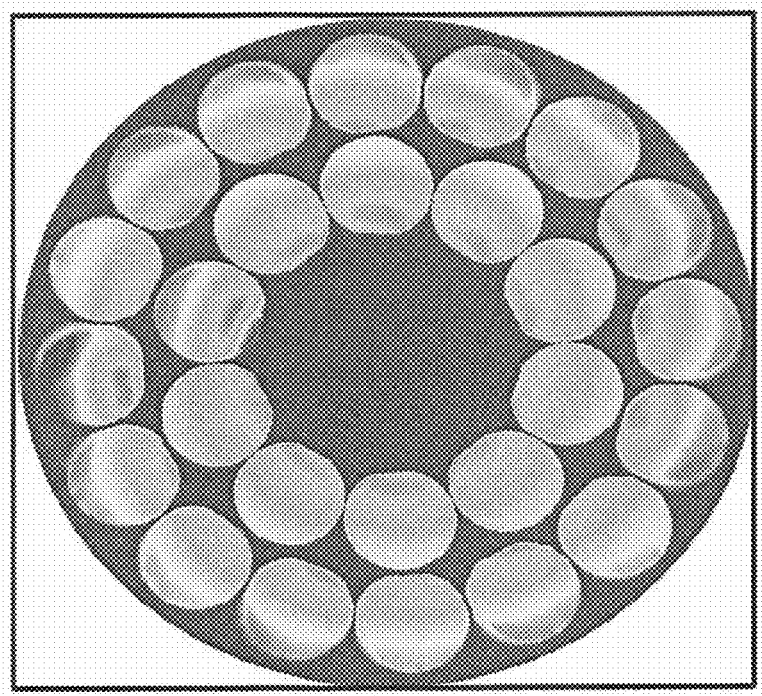
FIGS. 8A-8B are exemplary visual representations of a wafer carrier and measured tilt angle values with different shades representing amount of tilt.
Figure 8B:
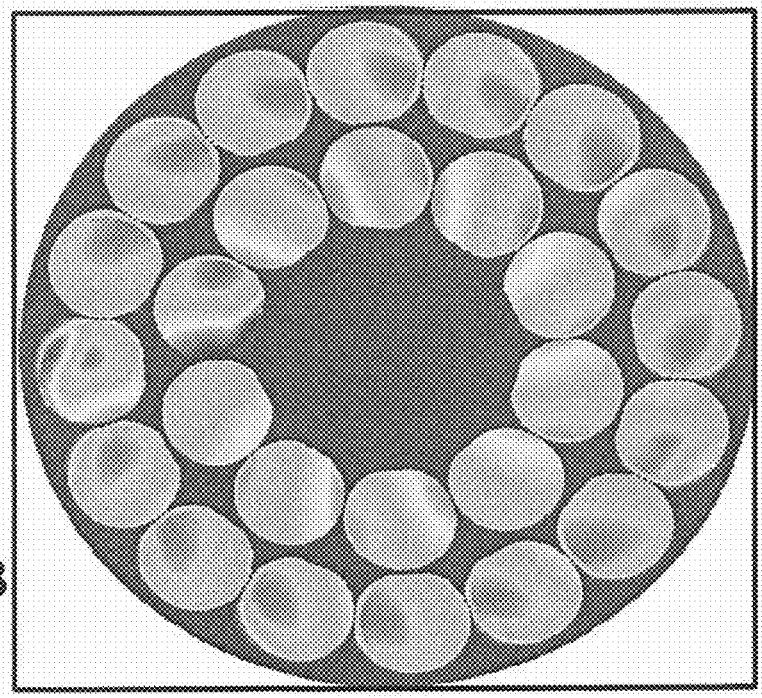

FIGS. 8A-8B are exemplary visual representations of a wafer carrier and measured tilt angle values (with different shades representing amount of tilt). FIG. 8A illustrates the tilt values for the radial direction, and FIG. 8B illustrates the tilt values for the tangential direction. Although each set of tilt data from which the visual representations can be stored as separate data structures (i.e., a first data structure corresponding to tilts along the radial direction and a second data structure corresponding tilts along the tangential direction), a composite data structure may be generated that represents the tilt direction and amount of tilt for each measured point.

Wafer positional coordinate system conversion engine 348 is programmed, or otherwise configured, to convert the positional coordinates for each measured point, as well as the tilt angles, to a wafer-specific coordinate system for each wafer. This conversion is performed based on wafer carrier layout data 350, which represents each wafer's position and orientation relative to the wafer carrier's coordinate system. For instance, in one embodiment, each wafer's center can be defined as an origin for the corresponding wafer coordinate system, and a wafer-specific reference axis (e.g., the y-axis) can be defined relative to (e.g., aligned with, perpendicular to, etc.) a radius of wafer carrier 85.

Figure 9:
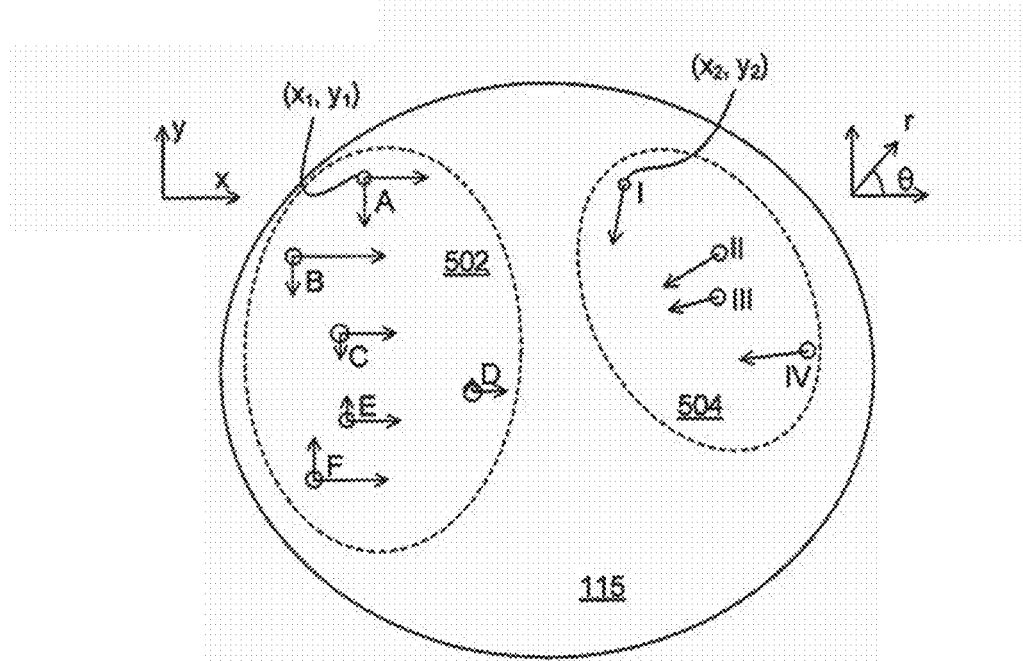
FIG. 9 is a diagram illustrating various wafer-specific coordinate systems that can be applied to represent tilt angle measurements on a wafer by a wafer positional coordinate system conversion engine according to one embodiment.

FIG. 9 is a diagram illustrating various wafer-specific coordinate systems that can be applied to represent tilt angle measurements on a wafer 115 by wafer positional coordinate system conversion engine 348. In one embodiment, as represented by measurement points of group 502 (labeled A-F), the location of each point is represented according to a corresponding pair of Cartesian coordinates $(x_1, y_1)$. The tilt angles computed by deflection-to-tilt angle conversion engine 346 are also represented in the x-y plane as having a first tilt angle component along the x vector and a second tilt angle component along the y vector.

In another embodiment, represented by the points of group 504, each measurement point, labeled I-IV, is represented at a corresponding pair of Cartesian coordinates $(x_2, y_2)$ for its location. The tilt angle in this embodiment is represented not in Cartesian coordinates, but in polar coordinates $(r, \theta)$ specific to the wafer. Accordingly, the tilt angle is represented by a vector having a direction and amplitude. Preferably, all of the measurement points on each wafer 115 are represented using the same coordinate system, such that no two groups of measurement points on a given wafer have different coordinate types, though such an arrangement is not necessarily excluded from falling within the scope of the invention if no such limitation is called out expressly.

In a related embodiment, both, the location of each measurement point, as well as the tilt angle, are represented by polar coordinates. In still another embodiment, the location of each measurement point is represented in polar coordinates, with the tilt angles being represented in Cartesian coordinates. These embodiments exemplify the general principle that any suitable coordinate system may be employed for representing the location and tilt angles.

It is also to be understood that wafer positional coordinate system conversion engine 348 and wafer carrier layout database 350 are optional components. Thus, for instance, the coordinate system in which the locations and tilt angles of the measurement points are represented can be the wafer carrier's coordinate system.

The resulting product of the processing performed by tilt mapping engine 330 is wafer tilt map 352. Wafer tilt map 352 is a data structure (or an associated combination of data structures) stored in a tangible data storage medium representing the location of each measurement point, and the corresponding tilt angle.

Notably, though FIGS. 7-9 illustrate tilt mapping with a visual depiction showing wafer carrier 85 and wafer 115, it will be understood that wafer tilt map 352 can be also represented (and processed) as a numerical construct such as a list, table, tree, vector, multi-dimensional array, bitmap, or other suitable data structure.

Figure 10:
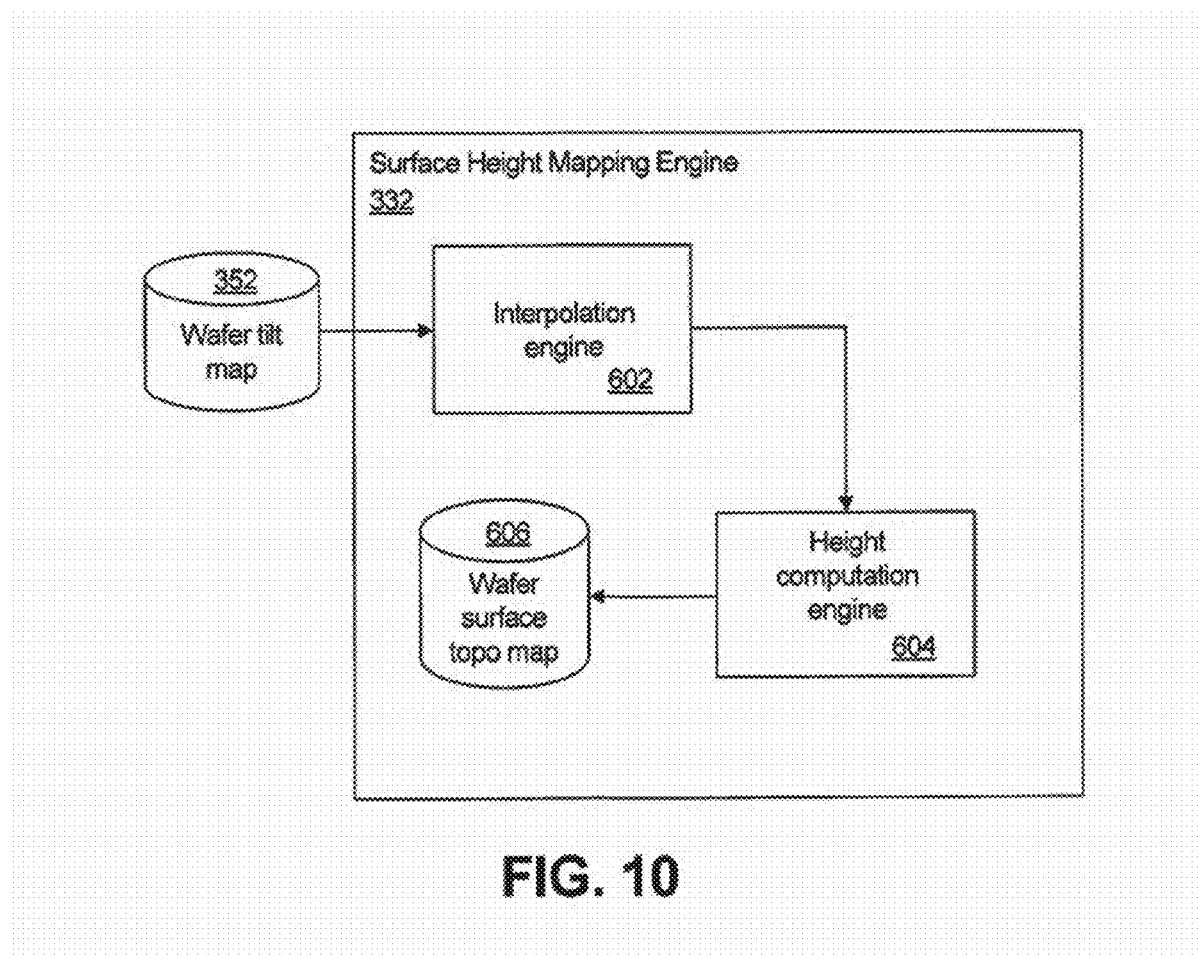
FIG. 10 is a block diagram illustrating a surface height mapping engine according to one embodiment.

FIG. 10 is a block diagram illustrating surface height mapping engine 332 in greater detail according to one embodiment. Surface height mapping engine 332 produces a three-dimensional topographical map 606 of the surface of each wafer 115. Surface height mapping engine 332 includes interpolation engine 602 and height computation engine 604. Surface height mapping engine 332 obtains wafer tilt map 352 for each wafer (or, in the embodiment where only the wafer carrier's coordinate system is used, for the wafer carrier surface). Interpolation engine 602 is an optional component that is provided in some embodiments for estimating the tilt at locations on wafers 115 that were not measured.

Figure 11:
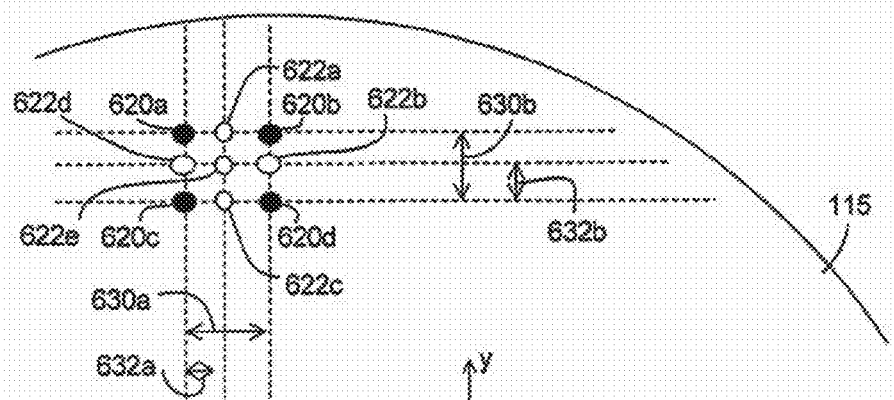
FIG. 11 illustrates the operation of an interpolation engine according to one embodiment.

FIG. 11 illustrates the operation of interpolation engine 602 according to one embodiment. Wafer 115 is depicted with several measured points 620a-d for which tilt angle data was taken. The locations of each of measured points 620a-d are shown at a resolution 630a along the x-direction and a resolution 630b along the y direction. Interpolation engine 602 estimates the tilt of additional points 622a-e located between measured points 620a-d. In this example, the x and y positions of each additional point are automatically chosen as midpoints between other points. Thus, additional points 622a-d are each located between a pair of measured points from among points 620a-d. Notably point 622e is defined as a midpoint between additional points 622a-d. For each tilt angle estimation for points 622a-e, the tilt can be interpolated as an average value from among the neighboring points for which the tilt angles are known. As a result, a finer resolution (e.g., 632a and 632b) of tilt angle points is generated.

It should be noted that, in related embodiments, the coordinate system can be represented in polar coordinates. Also, in other related embodiments, interpolation engine 602 can operate on data representing the wafer carrier surface, rather than for individual wafers. In another related embodiment, interpolation engine 602 can extrapolate tilt angle values for points located near other points for which the tilt angles have been determined or otherwise estimated based on linear extrapolation, or on a curve-fitting function extrapolation technique.

Height computation engine 604 is programmed, or otherwise configured, to generate a relative height for the points on surface of wafers 115 based on the tilt (measured or interpolated) for each point, and on the tilt of neighboring points. In one embodiment, a finite-element method is employed in which small sections of the surface of wafer 115 are approximated, and stitched together to produce a three-dimensional topographic map of the greater surface.

Figure 12:
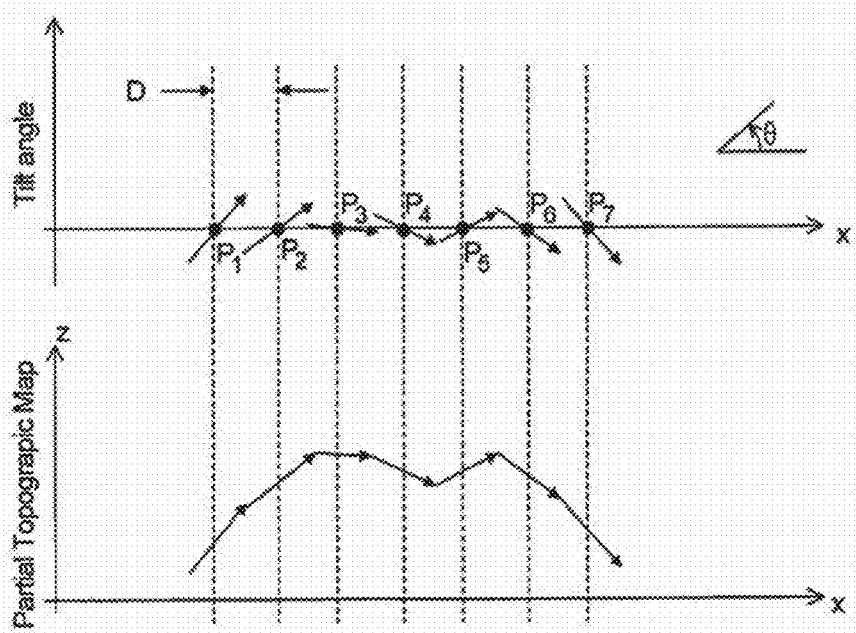
FIG. 12 is a simplified diagram illustrating an example of a principle of constructing a surface height mapping according to one embodiment.

FIG. 12 is a diagram illustrating an example of the principle according to one such embodiment, in a reduced-dimensionality depiction for simplicity. In the diagram, points $P_1$-$P_7$ represent measured or interpolated points located along an axis (e.g., the x-axis in this example). Points $P_1$-$P_7$ are located at a distance D from one another along the axis. The tilt of the surface of wafer 115 at each point is represented by a segment overlaid on each point. The angle θ of each segment represents the angle of the tilt measured along the axis.

According to one embodiment, the center of each segment is aligned with the corresponding point $P_1$-$P_7$. Accordingly, each segment contributes an element of height adjustment along the axis according to the equation h=D·tan θ, where h is the component of the height along the z-axis corresponding to the tilt along the axis. Stitching the segments together end-to-end produces the topographic map. Each subsequent point either adds to, subtracts from, or leaves unchanged, the height of the preceding point, depending on whether the tilt has a positive slope, negative slope, or zero slope, respectively. Although this simplified example is illustrated with tilts along a single axis, it will be understood that the tilt along a second coordinate (e.g., y-axis, or tangentially for polar coordinates) is also taken into account.

In the case of an x-y coordinate system used for a given wafer 115, where the spacing between measured or interpolated points is defined as ($D_x$, $D_y$) and the tilt at each point is represented as ($\theta_x$, $\theta_y$), then the height at a given point is given by:

$$h = h_0 + D_x\theta_x + D_y\theta_y,$$

where $h_0$ is the height determined for an adjacent point from which distances $D_x$ and $D_y$ were given. In a related embodiment, a reference height is assigned to a certain point or set of points. For instance, portions of the wafer surface located immediately above the corner of ledge 235 (FIG. 3) can be assigned to a nominal height of zero. In a related embodiment, the nominal height is selected as the center point of the wafer.

Figure 13:
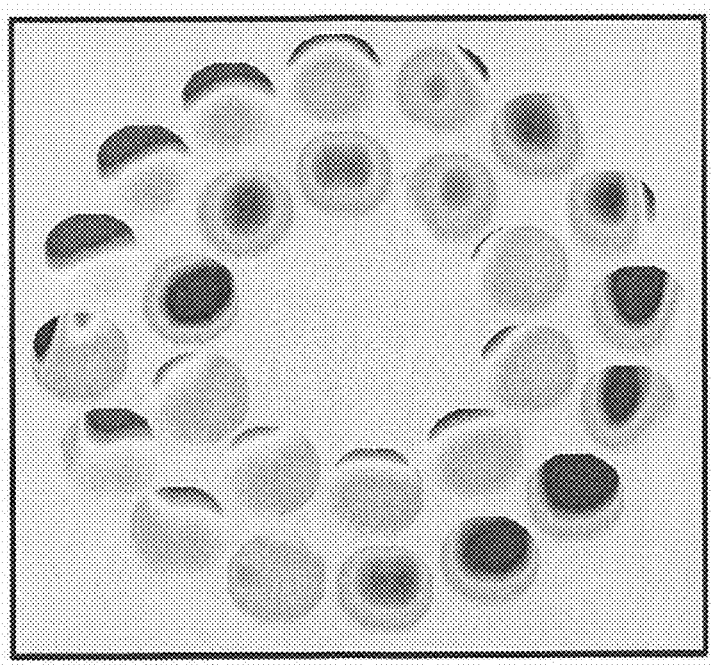
FIG. 13 is a visual depiction of a 3-dimensional topographical map of a wafer carrier on which a plurality of wafers are situated, in which the various shades represent different height values, as produced according to the operation of a surface height mapping engine according to one embodiment.
Figure 14:
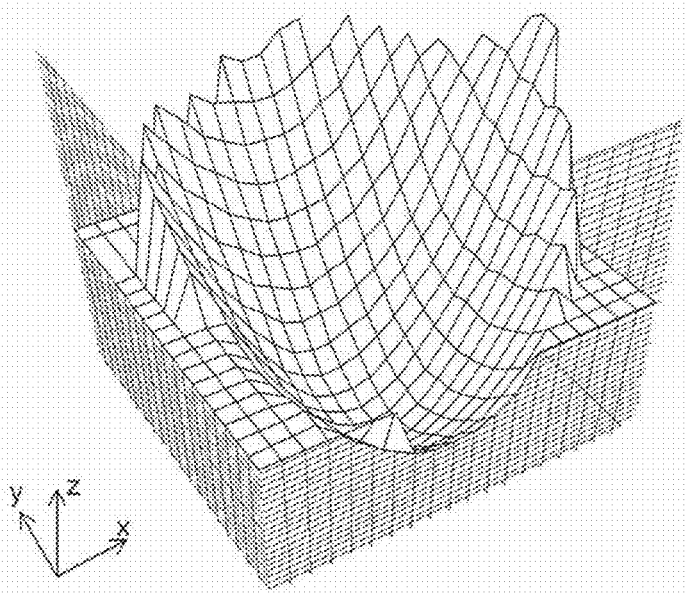
FIG. 14 is a visual depiction of a 3-dimensional topographic map of a single wafer, with the surface height shown along the z-axis, as produced according to the operation of a surface height mapping engine according to one embodiment.

FIGS. 13-14 illustrate various embodiments of three-dimensional topographical map 606. FIG. 13 is a visual depiction of a 3-dimensional topographical map of a wafer carrier on which a plurality of wafers are situated. In this visual depiction, the various shades represent different height values. FIG. 14 is a visual depiction of a 3-dimensional topographic map of a single wafer 115, with the surface height shown along the z-axis. In practice, three-dimensional topographical map 606 can be represented as a numerical construct such as a list, table, tree, vector, multi-dimensional array, bitmap, or other suitable data structure. A graphical image depicting the three-dimensional surface of each wafer 115 can be produced by a graphics generator engine (not shown) that is coupled with a user interface in which the graphical image can be selectively manipulated in response to user commands in order to vary the map type, viewing perspective, zoom, etc.

The three-dimensional topographical map 606 can further be passed to an analytics engine (not shown) in which the wafer surface topography of each wafer 115 is compared to one or more models, or wafer-to-wafer as between other wafers 115. Wafer topography can be compared between wafers situated in the same wafer retention pocket from one process run to the next in order to ascertain whether repeatable attributes of a given process are responsible for creating certain topographic features. This type of information is applicable in the development or refinement of process parameters, wafer carriers, process chamber hardware, and other aspects of the CVD processing or instrumentation.

Another aspect of the invention is directed to multi-modal surface scanning using multiple different instruments on scanning positioner 300. For example, in one embodiment, an ultraviolet (e.g., 375 nm) laser reflectivity measuring instrument together with visible (450-700 nm) laser reflectivity instrument is used to in situ characterize and monitor multiple quantum well thickness, roughness and composition, as well as 2D to 3D growth transition, layer end detection. In a related embodiment, an additional photoluminescence (PL) instrument is incorporated onto scanning positioner 300 to provide simultaneous wavelength and intensity maps of all the wafers on the carrier at or near the end of the process run. These instruments can be used to provide a number of indicia for the wafers. For instance, thickness of GaN film, thickness of multiple quantum wells, surface roughness, surface uniformity, and photoluminescence. For the wafer carrier surfaces, the instruments can provide temperature and emissivity measurements in situ.

In the other embodiments in which the rotation system a rotating tube or turntable, the mapping for the wafers in is similar to that described above for a wafer carrier having more than one wafer. For an embodiment where the wafer carrier supports a single wafer, or where the rotation system operates without a wafer carrier, the mapping of the wafer is similar to that described above except that the angular position of the wafer carrier and the linear position of the deflectometer at any given instant in time provides sufficient data from which to determine the point along the surface of the wafer at which the incident beam is aiming. The wafer is then mapped as discussed above.

The embodiments above are intended to be illustrative and not limiting. Other variations are contemplated to fall within the claims. In addition, although aspects of the present invention have been described with reference to particular embodiments, those skilled in the art will recognize that changes can be made in form and detail without departing from the scope of the invention, as defined by the claims. Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention may comprise a combination of different individual features selected from different individual embodiments, as will be understood by persons of ordinary skill in the art.

Any incorporation by reference of documents above is limited such that no subject matter is incorporated that is contrary to the explicit disclosure herein. Any incorporation by reference of documents above is further limited such that no claims that are included in the documents are incorporated by reference into the claims of the present application. The claims of any of the documents are, however, incorporated as part of the disclosure herein, unless specifically excluded. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. A system for non-contact analysis of a surface of at least one wafer, the system comprising:
   a deflectometer arranged to emit a beam toward the at least one wafer such that the beam is reflected from the surface of the at least one wafer to a deflection sensor, wherein variation in a tilt of the surface of the at least one wafer causes deflection of the beam detectable by the deflection sensor;
   a scanning positioner coupled to the deflectometer and operable to re-position the deflectometer over the surface of the at least one wafer such that the beam emitted by the deflectometer is scanned over the surface of the at least one wafer;
   a tilt mapping engine operatively coupled with an output of the deflectometer and configured to generate a mapping of tilt measured at a plurality of measurement points throughout the surface of the at least one wafer by the deflectometer; and
   a surface height mapping engine operatively coupled with the tilt mapping engine and configured to generate a three-dimensional topographic mapping of the surface of the at least one wafer based on the mapping of the tilt.

2. The system of claim 1, wherein the tilt mapping engine is configured to associate each of the plurality of measurement points with a corresponding position on a surface of the at least one wafer in a wafer-specific coordinate system.

3. The system of claim 1, wherein the at least one wafer comprises a plurality of wafers and wherein the tilt mapping engine is configured to associate each of the plurality of measurement points with a corresponding position on a surface of a corresponding wafer in a wafer-specific coordinate system, wherein each one of the at least one wafer corresponds to a unique wafer-specific coordinate system.

4. The system of claim 1, wherein the at least one wafer comprises a single wafer and wherein the tilt mapping engine is configured to associate each of the plurality of measurement points with a corresponding position on a surface of the wafer in a wafer-specific coordinate system.

5. The system of claim 1, wherein the three-dimensional topographic mapping of the surface of the at least one wafer represents a height of each wafer surface at a multiplicity of points on the at least one wafer, wherein the multiplicity of points for which the height is represented are located at the same locations as the measurement points.

6. The system of claim 1, wherein the three-dimensional topographic mapping of the surface of the at least one wafer represents a height of the corresponding surface at a multiplicity of points on each of the at least one wafer, wherein the multiplicity of points for which the height is represented includes points located at the same locations as the measurement points.

7. The system of claim 1, wherein the three-dimensional topographic mapping of the surface of the at least one wafer represents a height of each wafer surface at a multiplicity of points on the at least one wafer, wherein the multiplicity of points for which the height is represented includes points located at the same locations as the measurement points, and further includes additional points.

8. The system of claim 1, wherein the tilt mapping engine converts an initial set of raw data representing a tilt at each measurement point along radial and tangential components in a wafer carrier-specific coordinate system into a representation of tilt at each measurement point according to a Cartesian coordinate system.

9. The system of claim 1, wherein the surface height mapping engine is configured to computationally model the tilt of the surface of each wafer carrier as a plurality of small elements stitched together end-to-end.

10. The system of claim 1, wherein the surface height mapping engine includes an interpolation engine configured to estimate tilt values for additional points on the surface of the at least one wafer, based on measured tilt values for neighboring measurement points.

11. A system for growing epitaxial layers on at least one wafer by chemical vapor deposition (CVD), the system comprising:
   a reaction chamber including an enclosure defining a process environment space;
   a gas distribution device situated within the reaction chamber and arranged to convey at least one process gas into the process environment space;

a rotation system arranged to support a wafer carrier, the rotation system coupled to a rotary drive mechanism;

a deflectometer arranged to emit a beam toward a measurement point on the wafer carrier such that the beam is reflected from a surface of at least one wafer retained by the wafer carrier to a deflection sensor, wherein variation in a tilt of a surface of the at least one wafer causes deflection of the beam detectable by the deflection sensor;

a scanning positioner fixed to the reaction chamber and arranged to re-position the deflectometer over the wafer carrier such that the beam emitted by the deflectometer is scanned over a surface of each of the at least one wafer;

a tilt mapping engine operatively coupled with an output of the deflectometer and configured to generate a mapping of the tilt measured at a plurality of measurement points throughout the surface of the at least one wafer by the deflectometer; and a surface height mapping engine operatively coupled with the tilt mapping engine and configured to generate a three-dimensional topographic mapping of the surface of each of the at least one wafer based on the mapping of the tilt.

12. The system of claim 11, wherein the rotation system is a spindle coupled to the rotary drive mechanism.

13. The system of claim 11, wherein the rotation system is rotating tube coupled to the rotary drive mechanism.

14. The system of claim 11, wherein the tilt mapping engine is configured to associate each of the plurality of measurement points with a corresponding position on a surface of a corresponding wafer in a wafer carrier-specific coordinate system.

15. The system of claim 11, wherein the tilt mapping engine is configured to associate each of the plurality of measurement points with a corresponding position on a surface of a corresponding wafer in a wafer-specific coordinate system.

16. The system of claim 11, wherein the three-dimensional topographic mapping of the surface of each of the at least one wafer represents a height of each wafer surface at a multiplicity of points on each of the at least one wafer, wherein the multiplicity of points for which the height is represented are located at the same locations as the measurement points.

17. The system of claim 11, wherein the three-dimensional topographic mapping of the surface of each of the at least one wafer represents a height of each wafer surface at a multiplicity of points on each of the at least one wafer, wherein the multiplicity of points for which the height is represented includes points located at the same locations as the measurement points, and further includes additional points.

18. The system of claim 11, wherein the scanning positioner is arranged such that the beam emitted by the deflectometer is scanned along a radial direction over the wafer carrier.

19. The system of claim 11, wherein the tilt mapping engine converts an initial set of raw data representing a tilt at each measurement point along radial and tangential components in a wafer carrier-specific coordinate system into a representation of tilt at each measurement point according to a Cartesian coordinate system.

20. A method for non-contact analysis of a surface of at least one wafer, the method comprising:

emitting a beam toward the at least one wafer such that the beam is reflected from the surface of the at least one wafer;

detecting, based on a deflection of the beam reflected from the surface, a variation in a tilt of the surface;

scanning the beam over the surface of the at least one wafer; generating a mapping of tilt measured at a plurality of measurement points throughout the surface of the at least one wafer by a tilt mapping engine; and generating a three-dimensional topographic mapping of the surface of the at least one wafer based on the mapping of the tilt by a surface height mapping engine.

* * * * *